United States Patent [19]
Baba et al.

[11] Patent Number: 5,153,706
[45] Date of Patent: Oct. 6, 1992

[54] LEAD FRAMES FOR USE IN PLASTIC MOLD TYPE SEMICONDUCTOR DEVICES

[75] Inventors: Isao Baba, Fujisawa; Satoshi Takeuchi, Kawasaki; Kazunori Hayashi, Yokohama, all of Japan

[73] Assignee: Kabushiki Kaisha Toshiba, Kawasaki, Japan

[21] Appl. No.: 676,370

[22] Filed: Mar. 28, 1991

[30] Foreign Application Priority Data

Mar. 28, 1990 [JP] Japan .................................. 2-76595

[51] Int. Cl.[5] ............................................ H01L 29/60
[52] U.S. Cl. ............................................... 357/70; 357/72
[58] Field of Search ........................ 357/65, 68, 69, 70, 357/72

[56] References Cited

U.S. PATENT DOCUMENTS

| | | | |
|---|---|---|---|
| 4,855,807 | 8/1989 | Yamaji et al. | 357/72 |
| 4,942,455 | 7/1990 | Shinohara | 357/70 |
| 5,072,283 | 12/1991 | Bolger | 357/72 |

*Primary Examiner*—Frank Gonzalez
*Attorney, Agent, or Firm*—Foley & Lardner

[57] ABSTRACT

In a lead frame for use in a plastic mold type semiconductor device having a frame, a die pad on which a semiconductor element is mounted, a tie bar for connecting the die pad to said frame and for supporting the die pad, a plurality of leads whose inner ends of the leads are disposed around the die pad and the leads have inner leads portions which are portions to be sealed in a mold, metal plated region applied only to cover the inner lead and opposite end portions of the the die pad respectively confronting the inner leads, but the tie bar is not plated.

1 Claim, 1 Drawing Sheet

LEAD FRAMES FOR USE IN PLASTIC MOLD TYPE SEMICONDUCTOR DEVICES

BACKGROUND OF THE INVENTION

This invention relates to an improved construction for use in a plastic mold type of semiconductor device.

Generally, such semiconductor device as IC, LSI, etc. is manufactured by the steps of dividing a single semiconductor wafer on which a plurality of semiconductor elements are formed into separate chips (dicing step), mounting respective chips on respective packages or lead frames (die bonding step), interconnecting an electrode pad on each chip and an lead on each package or a lead frame with a fine gold wire or a fine aluminum wire (wire bonding step) and finally sealing with plastic resin respective chips and a portion of a lead connected thereto (sealing step).

In the die bonding step, which is performed prior to the wire bonding step, chips are secured to a ceramic package or to a die pad of a lead frame. By this operation, mechanical and electrical connections between the chips and the package can be made readily, and heat dissipation of their parts can be improved. Generally the die bonding step is desired that the connected parts (junctions) should have a high electroconductivity and a low thermal resistance and that the junction is physically and chemically stable. To form a die bonding satisfying these conditions the following three methods have been used, namely gold-silicon eutectic alloy method, soldering method and resin bonding method.

Since the gold-silicon eutectic alloy has a relatively low melting point of 370° C., it is widely used in the die bonding. The bonding is effected by pressing the rear surface of the chip to a gold plated die pad while heating them at a temperature of about 400° C. in an atmosphere of $N_2$ or a mixture of $N_2+H_2$ which are used for the purpose of preventing oxidation so as to cause gold-silicon eutectic reaction necessary for bonding. Since with this method a high degree of mechanical and electrical connections between the chip and the package can be obtained, this method is used widely. The soldering method utilizes a Pb-Sn type solder instead of the gold-Si eutectic alloy, and its operating temperature is relatively low, for example 200°–300° C. According to this method, a film of a Ni-Au alloy or a Ti-Ni-Au alloy which are wettable with solder, is formed on the rear surface of a chip by a metallizing technique, a small piece of a Pb-Sn type solder is interposed between the chip and a base metal layer, for example a plated silver layer, on a die pad, and the assembly is heated in an atmosphere comprising a mixture of $N_2$ and $H_2$ for bonding together the chip and the die pad. This method has the advantage that the thermal strain caused by the difference in the thermal expansion coefficients of a substrate and silicon is absorbed by the interposed solder layer so that even when the chip area of LSI, for example, becomes large, breakage of the chip would not occur.

According to the third method, a bonding agent (adhesive) is used. Generally, epoxy resin incorporated with a silver powder is used. The bonding agent is required to have such characteristics that it does not generate any gas giving an adverse influence upon the elements at the time of hardening and that it has a high heat conductivity and an electric conductivity. To ensure better bonding, the die pad is plated with gold or silver which decreases electric contact resistance. Since the setting temperature of the epoxy resin is about 150°–200° C., the bonding operation can be made at a lower temperature than the first and second methods so that it is possible to mount a large chip capable of absorbing heat strain caused by the difference in the thermal expansion coefficients. For this reason, the third method is widely used for automating the operation and reducing the cost of assembling.

In any one of the three methods, gold or silver is generally plated on the lead frame.

FIG. 2 is a plan view showing a typical prior art plated leads frame 10 which is constituted by a plurality of leads 5, a die pad 2 for mounting chips and tie bars 3 for supporting the die pad 2. An assembly of these circuit elements constitutes a unit, and a plurality of units are combined in series to form an entire lead frame. This lead frame is sealed with plastic resin within the region designated by a reference numeral 6. Lead portion inside of the plastic mold is called as inner lead and that outside of the plastic mold is called as outer lead. A region to be plated is shown by a hatched portion 4, and this region includes the entire portion of the die pad 2, tie bars 3 adapted to interconnect the lead frame 1 and the die pad 2 and inner portions (corresponding to the bonding portions) confronting the die pad 2. Among the materials utilized for the lead frame 1 are included Cu and 42 alloy which is a ferrous alloy containing 42% by weight of Ni. As above described Au, Ag, Ni, etc. are employed as plating materials. Furthermore, since the inner leads are connected to bonding wires for increasing the bonding forces between them, the inner leads are plated with Ag, for example. This measure is necessary for any one of the three methods described above.

In this manner, in the step of die bonding for mounting a chip (semiconductor element) on the bed frame of the lead frame, it is a general practice to plate the entire die pad with metal so that forming a satisfactory plating is an essential factor of this step.

According to a conventional method, since the entire surface of the die pad is plated, the area of the plated pattern or region is wide resulting in a longer plating time and increase in the cost of the lead frame. Moreover, when a plurality of lead frames plated with silver are stacked, lead frames touching each other would be bonded together thus forming a defective product. At the present time, tie bars are also plated with metal, for example silver. Where a plated pattern is formed a misalignment would occur between the lead frame and the plating pattern. In such a case, the plated portion often protrudes to the outside of the molded resin. Then silver migration would occur at such portion, thus often short circuiting the other tie bars.

SUMMARY OF THE INVENTION

Accordingly, it is an object of this invention to provide an improved lead frame for use in a resin sealed type semiconductor device by optimizing the plated region, which can be produced at a high production efficiency and a high reliability.

According to this invention, there is provided a lead frame for use in a plastic mold type semiconductor device comprising: a frame, a die pad on which a semiconductor element is mounted, a tie bar for connecting the die pad to the frame, and for supporting the die pad, a plurality of leads, inner ends of the leads being disposed around the die pad, the leads having inner leads, which are portions to be sealed in a mold, and a metal plated region applied on the lead frame, the metal plated region being applied only to cover the inner leads and opposite end portions of the die pad respectively confronting the inner leads, and not to cover the tie bar.

BRIEF DESCRIPTION OF THE DRAWINGS

In the accompanying drawings.

DESCRIPTION OF THE PREFERRED EMBODIMENT

Figure 1:
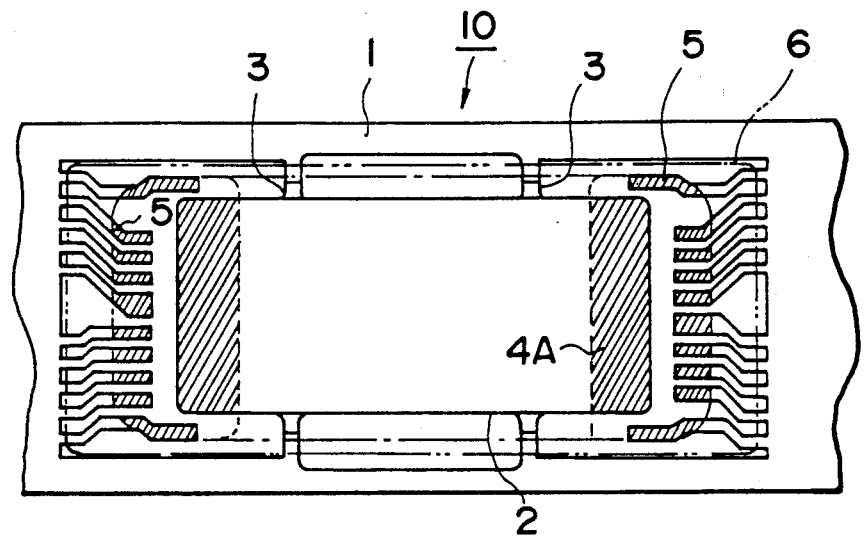
FIG. 1 is a plan view showing a lead frame embodying this invention and utilized in a semiconductor device.

A preferred embodiment of this invention will now be described with reference to FIG. 1 which shows a lead frame 1 supporting a die pad 2 on which a chip is to be mounted.

The lead frame 1 is made of metal, for example copper, and constituted by a frame 1, a die pad 2 supported by four tie bars 3, two groups of inner leads of leads 5, each opposing one end of the die pad 2 and outer leads (not shown) connected to respective inner leads and extending outwardly. Then the lead frame is plated. However different from the prior art construction, the entire surface of the die pad 2 is not plated, as the central portion is not plated. For plating the lead frame the lead frame is covered by a mask, not shown, and molten plating metal is sprayed onto a not masked portion of the lead frame. As a consequence, plated regions 4A are formed on only both end portions of the die pad 2 facing the inner ends of the inner leads 5. As a consequence, four tie bars 3 laterally projecting from the central portion of the die pad 2 are not plated with silver, for example, so that at the time of sealing the lead frame and chips with plastic resin it is not necessary to use any means which prevents exposure of the plated layer out of a resin layer, and moreover, there is no fear of degrading humidity proofness. Furthermore, since the area of the plated region is much smaller than the prior art area, there is no fear of bonding together adjacent lead frames when they are bonded together.

At the time of spraying molten plating metal onto the lead frame mounted on a substrate and clamped by a jig made of a resilient material, for example rubber, portions of the lead frame to be plated is not covered by the jig so that according to the prior art method, the jig is not placed, near hanging pins so that portions of the opposite side of the lead frame would be plated. However, according to this invention, since this portion is not plated the jig can be used, thus preventing leakage of the plated metal.

After forming the plated region 4A an epoxy resin adhesive incorporated with a powder of silver, for example is coated on the die pad 2. Then chips are mounted on the binder and pressure is applied on the chips for bonding the chips. The level of the die pad2 of the lead frame is selected to be lower than that of the leads by about 0.2–0.4 mm. In the following wire bonding step, respective inner leads and respective corresponding electrode pads are electrically interconnected through respective bonding wires.

Finally the chips, bonding wire and inner leads are sealed with an epoxy resin, for example. Although in this embodiment, a method of transfer molding was used, other methods, potting, for example can also be used.

Figure 2:
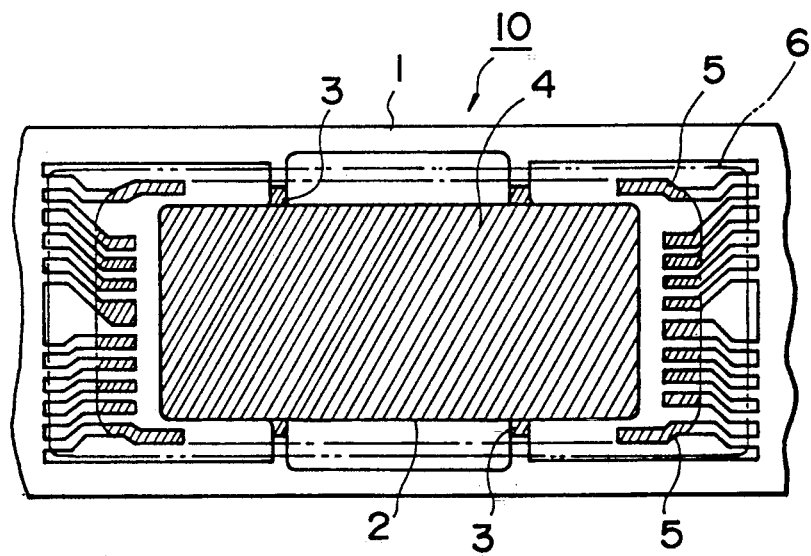
FIG. 2 is a plan view showing a prior art lead frame utilized in a semiconductor device.

Although copper was used for preparing the lead frame other metals, for example a 42 alloy which is ferrous alloy containing 42 weight % of Ni can also be used. Furthermore, instead of dual type lead frames any one of prior known type lead frames can be used. It should be understood that any plating metal, for example gold, Sn-Ni and Ni-Au alloys can be used instead of Ag. As shown in FIG. 2, the contact lines between the plated region and unplated region on the die pad are rectilinear, but these lines may be curved or irregular, provided that there is non-plating region. Metal plating has been applied for the purpose of decreasing the rear surface resistance of the chips at the time of resin bonding, it becomes unnecessary to decrease the rear surface resistance so much with the advances in circuit technogogies and layout of the circuit elements, so that according to this invention it becomes possible to decrease the area of the unplated portions.

What is claimed is:

1. A lead frame for use in a plastic mold type semiconductor device comprising:

a frame, a die pad on which a semiconductor element is mounted, a tie bar for connecting the die pad to said frame, and for supporting said die pad, a plurality of leads, inner ends of the leads being disposed around said die pad, said leads having inner leads, which are portions to be sealed in a mold, and a metal plated region applied on the lead frame, said metal plated region being applied only to cover said inner leads and opposite end portions of the said die pad respectively confronting the inner leads, and not to cover said tie bar.

* * * * *